(12) United States Patent
Roche et al.

(10) Patent No.: US 9,414,511 B2
(45) Date of Patent: Aug. 9, 2016

(54) CASE FOR ELECTRONIC DEVICE WITH ADHESIVELY ATTACHED COVER

(71) Applicant: HIKOB, Villeurbanne (FR)

(72) Inventors: Guillaume Roche, Villeurbanne (FR);
Christophe Braillon, Villeurbanne (FR);
Antoine Fraboulet, Villeurbanne (FR);
Guillaume Chelius, Villeurbanne (FR)

(73) Assignee: HIKOB, Villeurbanne (FR)

( * ) Notice: Subject to any disclaimer, the term of this patent is extended or adjusted under 35 U.S.C. 154(b) by 587 days.

(21) Appl. No.: 13/737,722

(22) Filed: Jan. 9, 2013

(65) Prior Publication Data

US 2013/0240234 A1    Sep. 19, 2013

(51) Int. Cl.
*H05K 5/00* (2006.01)
*H05K 5/06* (2006.01)

(52) U.S. Cl.
CPC ............. *H05K 5/061* (2013.01); *H05K 5/00* (2013.01); *H05K 5/06* (2013.01); *H05K 5/063* (2013.01); *H05K 5/0095* (2013.01)

(58) Field of Classification Search
CPC .......... H05K 5/02; H05K 5/06; H05K 5/061; H02G 3/08–3/088
USPC .................... 174/50, 53–67, 480–51
See application file for complete search history.

(56) References Cited

U.S. PATENT DOCUMENTS

| | | | | |
|---|---|---|---|---|
| 2,832,495 A * | 4/1958 | Batts | | 220/3.7 |
| 2,892,250 A * | 6/1959 | Bartels | | 29/613 |
| 3,974,933 A * | 8/1976 | Toth et al. | | 220/3.8 |
| 4,158,102 A * | 6/1979 | Bright | | 174/37 |
| 4,874,714 A * | 10/1989 | Eklund | | H01L 27/0629 257/384 |
| 5,059,748 A * | 10/1991 | Allen et al. | | 174/87 |
| 5,522,861 A * | 6/1996 | Sikorski et al. | | 607/36 |
| 5,838,540 A * | 11/1998 | Wen-Shyong | | H04N 1/00519 206/316.1 |
| 5,942,728 A | 8/1999 | Chen | | |
| 5,998,800 A * | 12/1999 | Geinitz et al. | | 250/506.1 |
| 6,307,154 B1 * | 10/2001 | Gretz | | 174/50 |
| 6,549,423 B1 * | 4/2003 | Brodnick | | H05K 5/0095 361/798 |
| 7,227,757 B2 * | 6/2007 | Mizutani | | 361/752 |
| 8,203,830 B2 * | 6/2012 | Yang et al. | | 361/679.01 |
| 2003/0026082 A1 * | 2/2003 | Gustine | | H05K 5/0004 361/801 |

(Continued)

FOREIGN PATENT DOCUMENTS

DE   10 2008 043478 A1   5/2010
FR         2 831 384 A1   4/2003

OTHER PUBLICATIONS

French Search Report dated Jul. 27, 2012, as issued in corresponding French Application No. 1250222, filed Jan. 9, 2012.

*Primary Examiner* — Jeremy C Norris
*Assistant Examiner* — Muhammed Azam

(57) ABSTRACT

A case for an electronic device has a hollow body which forms at least one receiving housing for an electronic device (E) and has an access opening to the housing surrounded by a peripheral edge outside the housing which has a truncated conical or truncated pyramidal shape converging on the opening. The case further includes a cover for closing the housing which has a peripheral flange. The inner peripheral face has a truncated conical or truncated pyramidal shape complementary to the shape of the peripheral edge of the opening of the case, the flange of the cover being designed to fit onto the peripheral edge of the opening and be held there by adhesion.

10 Claims, 6 Drawing Sheets

(56) References Cited

U.S. PATENT DOCUMENTS

| | | |
|---|---|---|
| 2006/0122519 A1* | 6/2006 | Nakamura .................. 600/502 |
| 2006/0263075 A1 | 11/2006 | Juan et al. |
| 2007/0158094 A1* | 7/2007 | Burca et al. .................. 174/66 |
| 2008/0259547 A1* | 10/2008 | Kim .............................. 361/681 |
| 2009/0260845 A1* | 10/2009 | Kai et al. ..................... 174/50.5 |
| 2012/0069517 A1* | 3/2012 | Prest et al. ............... 361/679.56 |
| 2012/0085766 A1* | 4/2012 | I et al. .......................... 220/378 |

* cited by examiner

CASE FOR ELECTRONIC DEVICE WITH ADHESIVELY ATTACHED COVER

RELATED APPLICATIONS

This application claims priority under 35 U.S.C. §119 to French Patent Application No. 1250222, filed on Jan. 9, 2012, the disclosure of which is incorporated by reference herein in its entirety.

The present invention relates to the technical field of protective cases for electronic devices. In a preferred but not exclusive application, the invention relates to the field of waterproof cases for autonomous electronic devices.

In the said field it is known to use protective cases made of plastic comprising a hollow cylindrical body, screw fastened onto which is a plug linked to a packing seal inserted between the plug and the cylindrical body, which presses onto it. Said cases give full satisfaction in terms of their function of protection of an electronic device inside the hollow body but have the disadvantage of requiring a relatively long assembly time due to the screw fastening of the plug. Furthermore, the presence of threads on both the plug and the hollow body requires the use of relatively complex and expensive moulds.

Accordingly, the need arose for a new type of case with protection characteristics equivalent or superior to those of the prior art cases but with a lower manufacturing cost and involving a very much shorter assembly time than the prior art cases.

To achieve these objectives, the invention relates to a case for an electronic device comprising:
  a hollow body which forms at least one reception housing for an electronic device and contains an opening for access to the housing surrounded by a peripheral edge outside said housing which has a truncated conical or truncated pyramidal shape converging on the opening,
  a cover closing the housing which comprises a peripheral flange wherein the inner peripheral face has a truncated conical or truncated pyramidal shape complementary to the shape of the peripheral edge of the opening, the cover flange being designed to fit onto the peripheral edge of the opening and be held there by adhesion.

By fixing the cover on the hollow body by conical fitting, the hollow body can be quickly closed by its cover. Further, with the conical fitting the closure can be made waterproof directly when necessary without the need to provide additional waterproof packing seals. It is therefore possible, in the case of parts made of plastic, to obtain waterproof class IP55 with moulds with a normal or ordinary surface texture and without a window. Furthermore, the truncated conical or truncated pyramidal surfaces of the cover and hollow body can be obtained with moulds of a simple and inexpensive shape. It should be noted that truncated conical or truncated pyramidal shapes demould naturally, due to their design. Also, because it is virtually impossible to dismantle the assembly without partly destroying the cover or hollow body, the case in the invention constitutes a system with evidence of having been opened, providing proof of the integrity of the contents of the case.

According to the invention, the shape of the peripheral edge and peripheral face is a truncated cone in the general meaning of the term, namely that it corresponds to an area defined by the intersection of two planes with a three-dimensional geometric figure formed by generatrices passing through an apex and bearing on a closed curve called a directrix. According to the invention, the directrix may take different forms, such as a polygon, circle or ellipse, this list being neither limitative nor exhaustive.

The type of fitting used by the invention is preferably the Morse cone, 5% metric cone or Brown & Sharpe cone.

According to a characteristic of the invention, the slant of the peripheral edge and peripheral face is between 1° and 3°.

Similarly, according to another characteristic of the invention, the slant of the peripheral edge and peripheral face is between 1% and 5.5%.

According to an embodiment of the invention, the cover and the body contain means of orientation of the cover in relation to the body. The use of said means of orientation allows coordination of the position of inscriptions or a mark on the cover and the electronic device inside the body. This facility allows the inscriptions on the cover to be used for correct orientation of the case and the electronic device it contains to suit their environment of use.

According to a variant of said embodiment, the orientation means comprise at least one rib which projects from the peripheral edge of the body and is designed to engage in a complementary groove in the flange.

According to another variant of said embodiment, the cover contains an orientation mark on an outer face.

According to the invention, the hollow body housing may be formed by any appropriate means. According to a characteristic of the invention, the housing comprises:
  opposite the opening, a space receiving at least one battery,
  and between the opening and the receiving space, a space to take an electronic device, According to a characteristic of the invention, the peripheral edge and face have a truncated conical shape.

According to another characteristic of the invention, the body and cover have a generally symmetrical circular shape, According to the invention the case may contain windows, for example to allow air to circulate between the inside of the case and the external environment.

According to an embodiment of the invention, the case is without a window so as to be waterproof once the cover is fitted onto the body.

According to a variant of said embodiment, the body and/or cover contains at least one peripheral packing seal designed to contribute to the waterproofing of the closure of the body by the cover.

Naturally, the different characteristics, variants and embodiments of the invention may be associated together in various combinations unless they are mutually incompatible or exclusive.

In addition, various other characteristics of the invention fall within the attached description given by reference to the drawings, which illustrate non limitative embodiments of cases conforming with the invention.

It should be noted that on these figures the structural and/or functional elements common to the different variants may have the same reference numbers.

Figure 1:
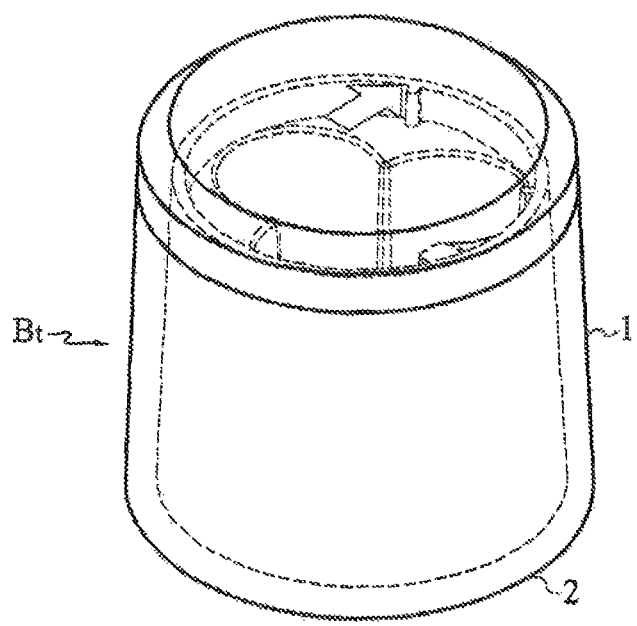
FIG. 1 is a schematic external perspective view of a case in accordance with the present invention.

A case Bt in accordance with the present invention, as illustrated in FIG. 1, comprises a hollow body 1, shown in dotted lines, closed by a cover 2 shown in full lines.

Figure 2:
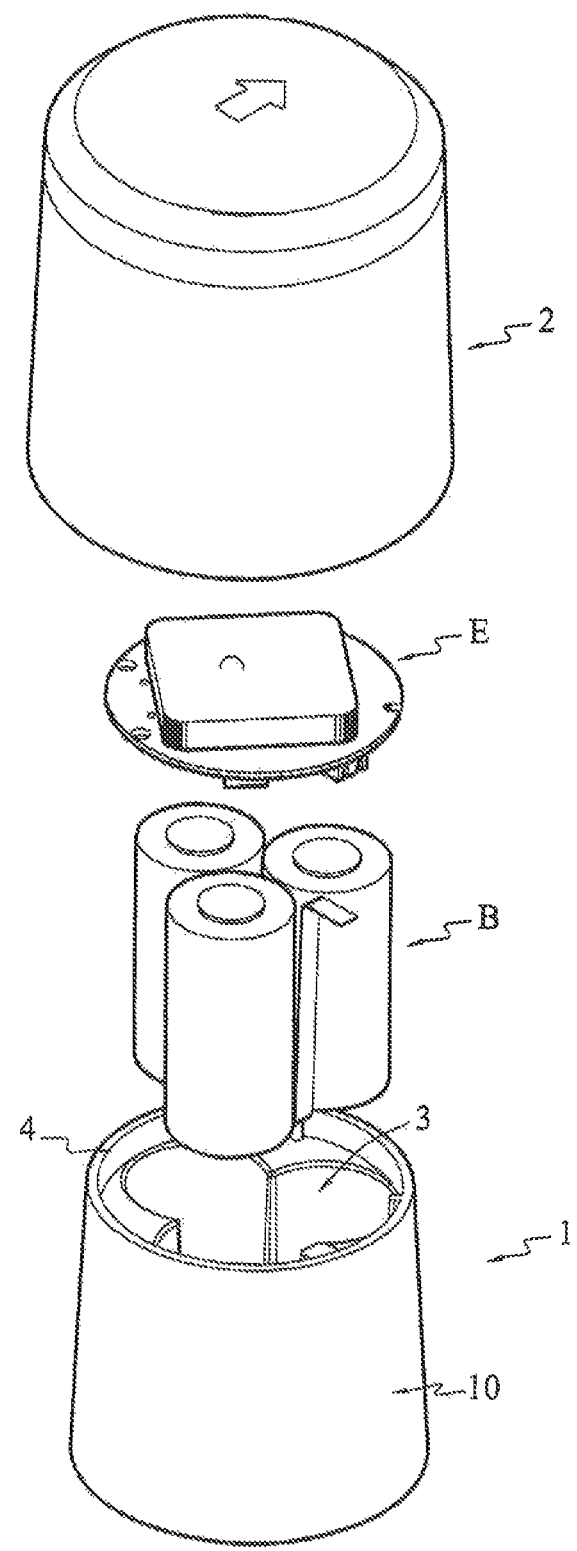
FIG. 2 is an exploded perspective view of the case illustrated in FIG. 1 showing the electronic device it contains.

As shown in FIG. 2, the hollow body 1 defines a receiving housing 3 for an electronic device E and its batteries B. In the example shown, the housing 3 is accessible from an opening 4. The housing 3 comprises a receiving space $3_1$ for three batteries B opposite the opening 4 and a space $3_2$ taking the electronic device E between the opening 4 and the receiving space $3_1$.

Figure 3:
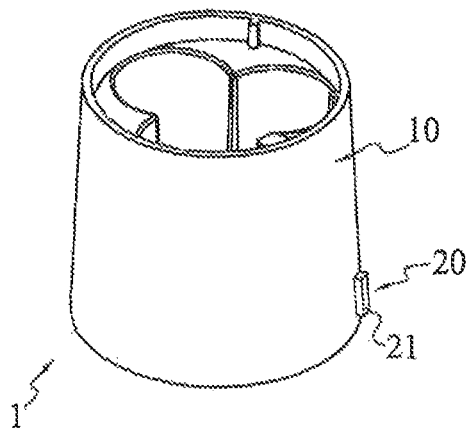
FIG. 3 is a schematic external perspective view of the hollow body forming the case illustrated in FIG. 1.
Figure 4:
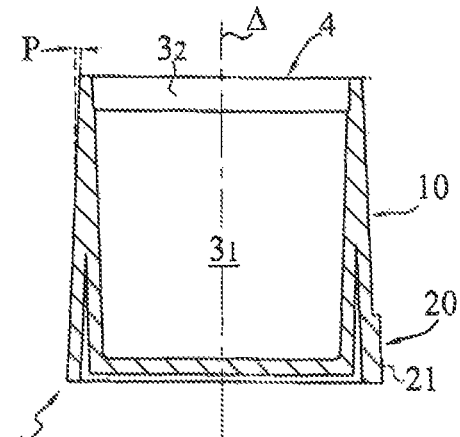
FIG. 4 is an axial section of the hollow body illustrated in FIG. 3.

The opening 4 is surrounded on the outside of housing 3 by a peripheral edge 10 which has a truncated conical shape converging on the opening 4, as shown in FIGS. 3 and 4. In the example illustrated, the peripheral edge 10 has a truncated conical shape of axis Δ and extends to the full height of the hollow body 1.

Figure 5:
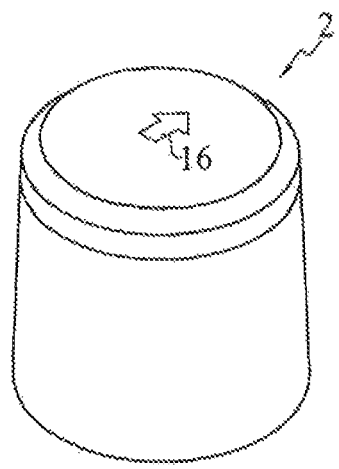
FIG. 5 is a schematic external perspective view of the cover forming the case illustrated in FIG. 1.
Figure 6:
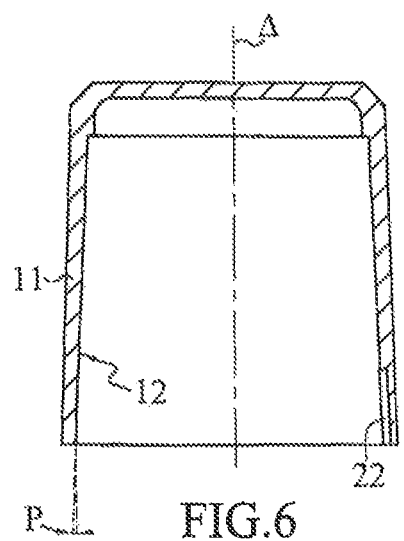
FIG. 6 is an axial section of the cover illustrated in FIG. 5.

To allow the cover 2 to fit onto the hollow body 1, it comprises a peripheral flange 11 wherein, as shown in FIGS. 5 and 6, the internal peripheral face 12 has a truncated conical shape complementing the truncated conical shape of the peripheral edge 10.

Figure 7:
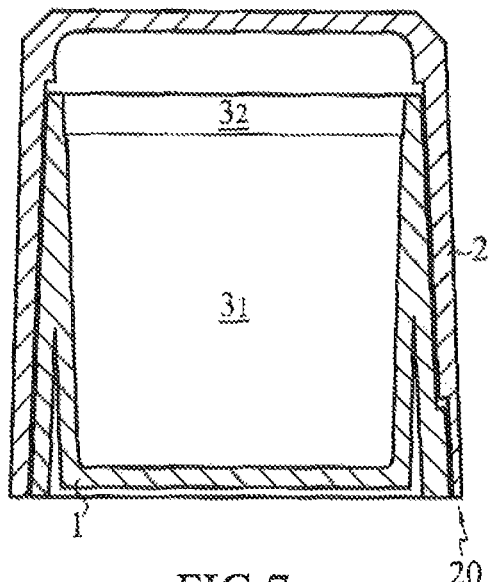
FIG. 7 is an axial section of the assembly of the hollow body illustrated in FIG. 3 with the cover illustrated in FIG. 5.

The case in accordance with the present invention is assembled as follows. The batteries B and electronic device E are placed in the housing 3 in turn. Then the cover 2 is placed on the hollow body 1 so that the peripheral flange 11 fits onto the peripheral edge 10 as shown in FIG. 7. The complementary truncated conical shapes of the inner peripheral face 12 and the peripheral edge 10 cause the cover 2 to be fixed on the hollow body 1 by adhesion without the need to use additional fastening means such as a bond or mechanical connection. It is clear that the case in accordance with the present invention is quick and easy to assemble without a special tool and can be assembled just before use of the electronic device E.

To guarantee the efficiency of this adhesion fixing, the truncated cone shapes of the inner peripheral face 12 and peripheral edge 10 are preferably designed to form a Morse cone, 5% metric cone or Brown & Sharpe cone. Thus, for example, the slant P of the peripheral edge 10 and inner peripheral face 12 is between 1° and 3° or between 1% and 5.5%.

Figure 8:
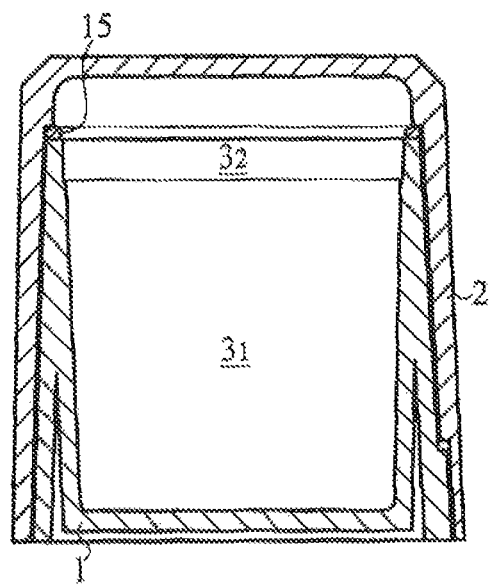
FIG. 8 is an axial section of an embodiment of a case in accordance with the present invention.

In the example illustrated, the hollow body 1 contains no opening other than the opening 34 for access to the housing 3, whilst the cover 2 contains no opening other than the one allowing the peripheral flange 11 to engage on the peripheral edge 10. Once assembled, the case formed by the cover 2 fitted onto the hollow body 1 is windowless and hermetically sealed and is therefore waterproof. If the hollow body 1 and the cover 2 are made of plastic injected into moulds with an ordinary surface texture, the case Bt resulting from their assembly has at least waterproofing class IP55 without the need to use additional waterproofing accessories. In this context the use of a silicone oil or, as illustrated in FIG. 8, a peripheral packing seal 15 gives waterproof class IP65. Said waterproof class may also be obtained by using moulds having a mirror surface for the parts forming the inner peripheral face 12 and the peripheral edge 10 so that simple contact between them achieves the waterproofing required.

In accordance with the example illustrated and described above, the cover 2 is bell shaped and completely contains the hollow body 1 so that it is almost impossible to separate them without damage. Therefore the conical fit formed by the invention ensures the integrity of the electronic device E contained in the case.

If the electronic device E uses a transducer which senses its position in the environment, as is the case for example with a magnetic transducer sensing the earth's magnetic field, the cover 2 has an orientation mark 16 on an outer face. To ensure that the position of the mark 16 corresponds to the orientation of the hollow body 1 in the cover 2, they contain means 20 of orientation of the cover 2 in relation to the hollow body. In the example illustrated, the orientation means 20 comprise a rib 21 which projects from the peripheral edge 10 and is designed to engage in a groove 22 formed in the inner peripheral face 12.

In accordance with the embodiment of the invention previously described, the case, hollow body 1 and cover 2 have an approximately truncated conical shape with approximately flat top and bottom bases. However, said configuration is not necessary to produce a case in accordance with the present invention.

Figure 9:
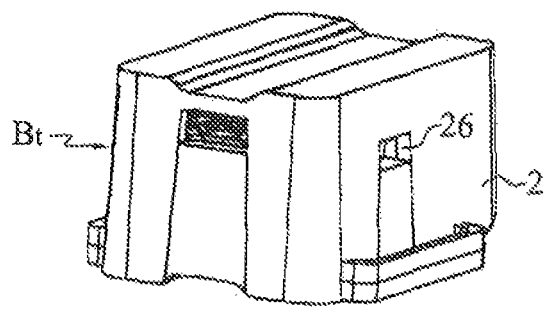
FIGS. 9 and 10 are schematic external perspective views of another embodiment of a case in accordance with the present invention.
Figure 10:
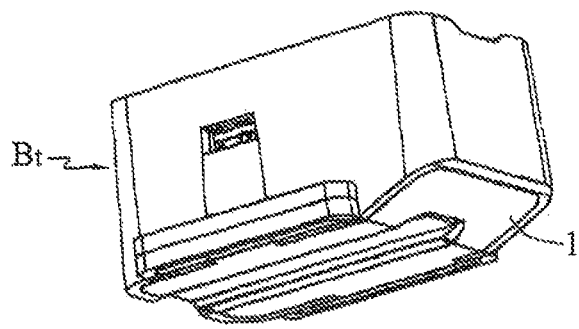
Figure 11:
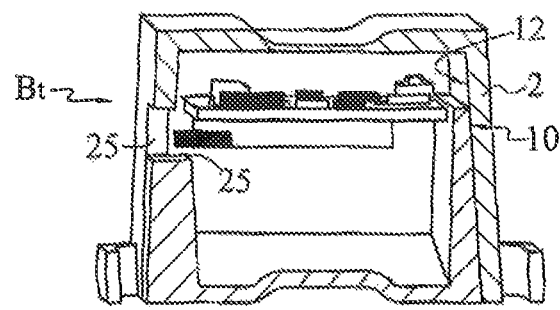
FIG. 11 is an extracted schematic perspective view of the case illustrated in FIGS. 9 and 10.

FIGS. 9 to 11 show a case Bt in accordance with the present invention having a generally truncated pyramidal shape with rounded edges and bases that are not flat. In this embodiment, the peripheral edge 10 and inner peripheral face 12 also have an approximately truncated pyramidal shape. Also, the cover 2 and the hollow body contain openings 25 so that the case B contains windows 26 allowing air to circulate between the housing 3 and the external environment.

Figure 12:
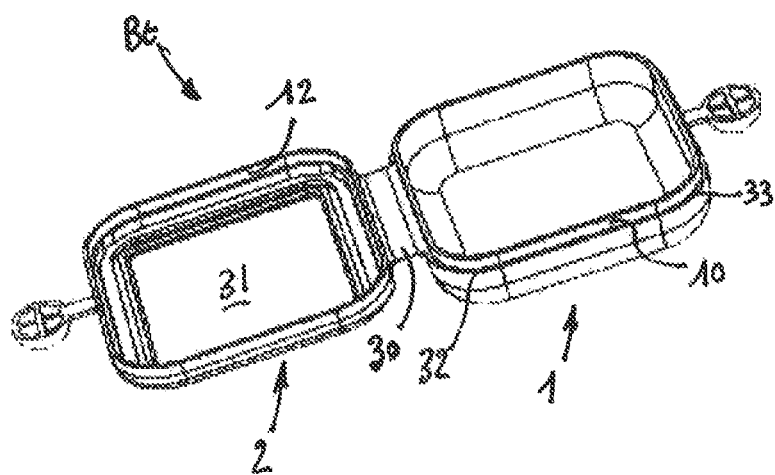
FIG. 12 illustrates in schematic perspective another embodiment of a case in accordance with the present invention.

FIG. 12 illustrates a case Bt in accordance with the present invention, wherein the hollow body 1 and cover 2 are connected by a hinge 30 which facilitates their operation. The peripheral edge 10 of the hollow body 1 has a male truncated pyramidal shape with rounded edges, whilst the inner peripheral face 12 of the cover has a complementary female, approximately truncated pyramidal shape. The cover 2 contains an opening 31 for installation of a solar power panel for an electronic device in the case Bt. To complete the waterproofing of the case Bt provided by the truncated conical fitting of the peripheral edge 10 in the inner peripheral face 12, the peripheral edge 10 of the hollow body 1 is edged by a flange 32 holding a packing seal 33 which is pressed between the flange 32 and the edge 34 of the cover 2 when the case Bt is closed.

Naturally, various other modifications may be made to the case in accordance with the present invention within the limits of the attached claims.

The invention claimed is:

1. A case for an electronic device, comprising:
    a hollow body having at least one receiving housing for an electronic device therein and which comprises an access opening to the housing surrounded by a peripheral edge outside the housing with a truncated conical or truncated pyramidal shape converging on the opening,
    a cover closing the housing and comprising a peripheral flange, wherein an inner peripheral face of the cover has a truncated conical or truncated pyramidal shape complementary to the shape of the peripheral edge, the flange of the cover being sized and shaped to fit onto the peripheral edge of the opening and be adhesively held thereto.

2. A case according to claim 1, wherein the slant of the peripheral edge and peripheral face is between 1° and 3°.

3. A case according to claim 1, wherein the slant of the peripheral edge and peripheral face is between 1% and 5.5%.

4. A case according to claim 1, further comprising a peripheral packing seal between the body and the cover designed to contribute to the waterproofing of the body closure by the cover.

5. A case according to claim 1, comprising means for orienting the cover in relation to the body.

6. A case according to claim 5, wherein the orientation means comprise at least one rib which projects from the peripheral edge of the body and a complementary groove formed in the flange, the at least one rib being engageable with the complementary groove.

7. A case according to claim 5, wherein the cover includes an orientation mark on an outer face thereof.

8. A case according to claim 1, wherein the housing comprises:
   opposite the opening, a receiving space for at least one battery, and
   between the opening and the receiving space, a space to receive an electronic device.

9. A case according to claim 1, wherein an interior of the case is waterproof when the cover is fitted onto the body.

10. A case according to claim 1, wherein the body and cover have a generally symmetrical circular shape.

* * * * *